US008406000B2

(12) United States Patent
Zaitz et al.

(10) Patent No.: US 8,406,000 B2
(45) Date of Patent: Mar. 26, 2013

(54) REINFORCED KEY FOB

(75) Inventors: Michael Joseph Zaitz, Royal Oak, MI (US); Jill Sara Logsdon, Madison Heights, MI (US)

(73) Assignee: Continental Automotive Systems US, Inc., Auburn Hills, MI (US)

( * ) Notice: Subject to any disclaimer, the term of this patent is extended or adjusted under 35 U.S.C. 154(b) by 423 days.

(21) Appl. No.: 12/669,999

(22) PCT Filed: Nov. 27, 2007

(86) PCT No.: PCT/US2007/085575

§ 371 (c)(1), (2), (4) Date: Jan. 21, 2010

(87) PCT Pub. No.: WO2008/067278

PCT Pub. Date: Jun. 5, 2008

(65) Prior Publication Data

US 2010/0220451 A1 Sep. 2, 2010

Related U.S. Application Data

(60) Provisional application No. 60/861,524, filed on Nov. 27, 2006.

(51) Int. Cl.
*H05K 5/00* (2006.01)

(52) U.S. Cl. .......................... 361/752; 361/807; 361/809

(58) Field of Classification Search .................. 361/728, 361/730, 752, 796, 800–803, 807, 810
See application file for complete search history.

(56) References Cited

U.S. PATENT DOCUMENTS

| | | | | |
|---|---|---|---|---|
| 5,746,307 | A * | 5/1998 | Joss et al. | 200/303 |
| 6,462,291 | B1 | 10/2002 | Sachs | |
| 6,614,905 | B1 * | 9/2003 | Kristensen | 379/368 |
| 6,691,539 | B2 | 2/2004 | Jacob et al. | |
| 6,705,141 | B1 | 3/2004 | Jacob et al. | |
| 7,041,924 | B2 * | 5/2006 | Jeschke et al. | 200/302.2 |
| 7,250,937 | B2 * | 7/2007 | Takagi | 345/168 |
| 7,348,512 | B2 * | 3/2008 | Iohara | 200/341 |
| 7,433,196 | B1 * | 10/2008 | Wang et al. | 361/752 |
| 7,499,283 | B2 * | 3/2009 | De Los Santos et al. | 361/752 |
| 7,701,727 | B2 * | 4/2010 | Chuang et al. | 361/797 |
| 7,897,888 | B2 * | 3/2011 | Dimig | 200/302.2 |

FOREIGN PATENT DOCUMENTS

| | | |
|---|---|---|
| DE | 102005014563 | 9/2006 |
| DE | 102005012326 | 10/2006 |

OTHER PUBLICATIONS

International Search Report and Written Opinion mailed Apr. 4, 2008, PCT/US2007/085575.

* cited by examiner

*Primary Examiner* — Hung S Bui
(74) *Attorney, Agent, or Firm* — Carlson, Gaskey & Olds PC

(57) ABSTRACT

An example key fob assembly includes a circuit board having a plurality of circuits in the keypad having a plurality of coupled buttons closing the plurality of circuits. A reinforcement member secures to a key fob housing between the circuit board and the keypad. The circuit board abuts the reinforcement member.

21 Claims, 2 Drawing Sheets

REINFORCED KEY FOB

CROSS REFERENCE TO RELATED APPLICATION

The application claims priority to U.S. Provisional Application No. 60/861,524 which was filed on 27 Nov. 2006.

BACKGROUND OF THE INVENTION

This application relates generally to a key fob assembly with an internal reinforcement member.

Key fob assemblies are known and used to initiate a wide variety of functions, particularly vehicle functions. Some key fobs include buttons for locking and unlocking a vehicle, for example. Vehicle operators often transport the key fob in their pocket or purse when not operating the vehicle.

Typical key fobs are exposed to a wide range of outside forces and environmental conditions. If the key fob is inadequately supported, some forces, such as those introduced when the key fob is dropped or crushed, can cause severe damage. Key fob manufacturers often require that the key fobs they manufacture withstand certain loads to avoid high numbers of damaged key fobs. Many key fobs include structures for absorbing loads to ensure that the key fob remains usable after loading.

Key fob buttons move relative to other portions of the key fob. Adequately supporting areas of the key fob near the buttons is especially difficult because the moveable buttons require adequate area to move, but offer little support. Soft touch buttons are especially unsupportive. Accordingly, many key fobs include exposed support structures separating adjacent buttons on the key fob. Exposed supports between the buttons complicate the overall key fob design, are not aesthetically pleasing, and are difficult to clean. Exposed supports require space between adjacent buttons, which increases the size of the key fob.

SUMMARY

An example key fob assembly includes a circuit board having a plurality of circuits in the keypad having a plurality of coupled buttons closing the plurality of circuits. A reinforcement member secures to a key fob housing between the circuit board and the keypad. The circuit board abuts the reinforcement member.

The example key fob assembly may further include a circuit board having a plurality of circuits and a keypad having a plurality of coupled buttons for closing the plurality of circuits. A reinforcement member has a portion located between the circuit board and the keypad. An upper housing engages the circuit board and the lower housing engages the upper housing and the support.

BRIEF DESCRIPTION OF THE DRAWINGS

These and other features of the present invention can be best understood from the following specification and drawings, the following of which is a brief description.

DETAILED DESCRIPTION OF THE PREFERRED EMBODIMENT

Figure 1:
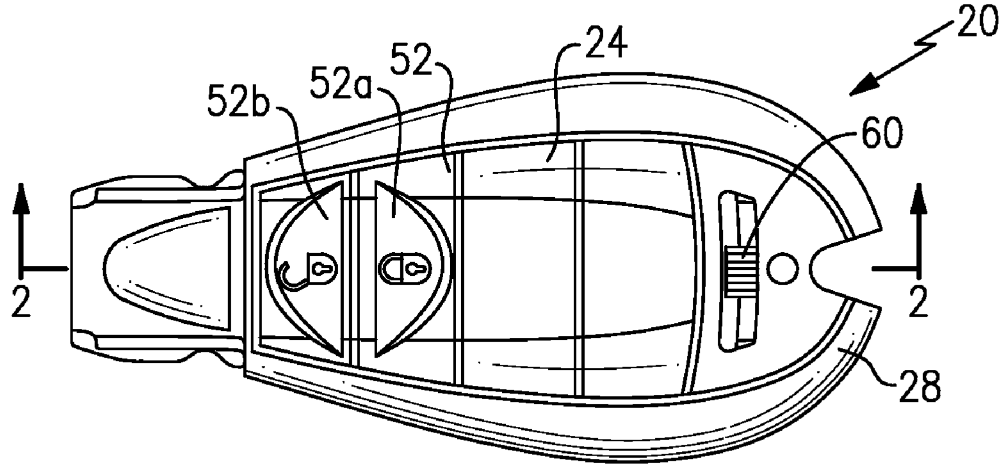
FIG. 1 shows a top view of an example key fob assembly.
Figure 2:
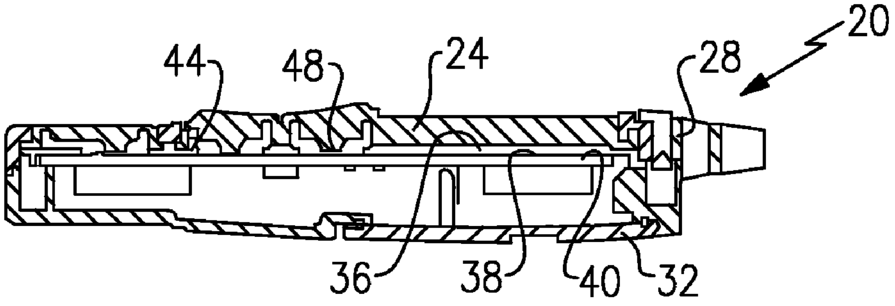
FIG. 2 shows a sectional view along line 2-2 of the FIG. 1 key fob.

Referring to FIGS. 1 and 2, an example key fob assembly 20 includes a keypad 24 within an upper housing 28. A lower housing 32 secures to the upper housing 28 to secure a reinforcement member 36 and a circuit board 40 within the key fob 20.

In this example, the reinforcement member 36 directly abuts the circuit board 40 at 38. A plurality of apertures 44 within the reinforcement member 36 permit snap domes 48 extending from individual buttons 52 or switches on the keypad 24 to contact portions of the circuit board 40. Contacting a circuit 78 on the circuit board 40 with one of the snap domes 48 closes the circuit 78.

The example key fob 20 includes various buttons 52, such as a lock 52*a* and an unlock switch 52*b*, for controlling vehicular functions. The key fob 20 further includes a slidably switch 60 for releasing a valet key, for example.

Figure 3:
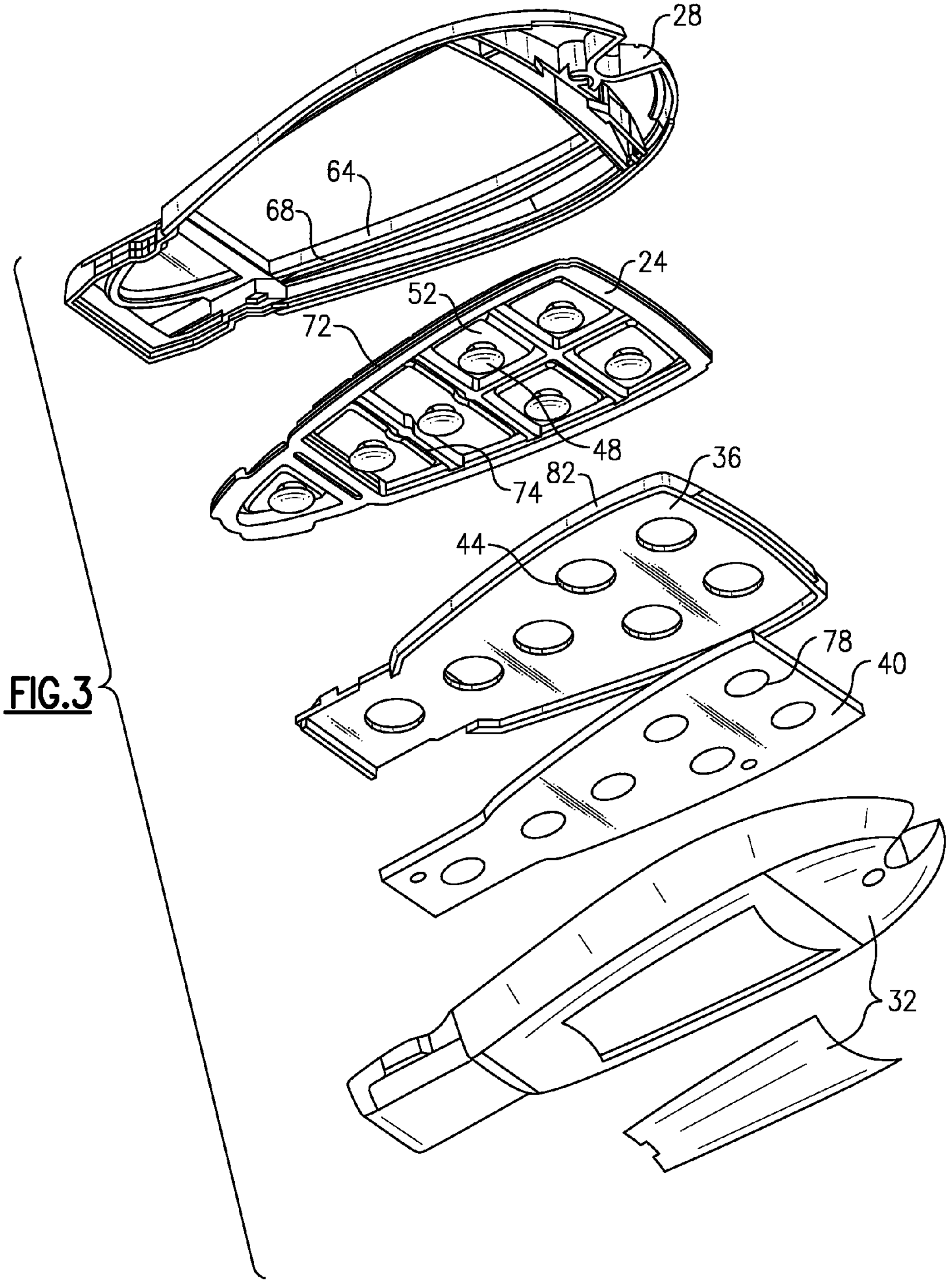
FIG. 3 shows an exploded view of the FIG. 1 key fob.

As shown in FIG. 3, the upper housing 28 includes an opening 64 for receiving the keypad 24. The upper housing 28 is a polymer material molded as a single piece. A ridge 68 around the opening 64 contacts a lip 72 on the keypad 24 to limit movement of the keypad 24 away from the remaining portion of the key fob assembly 20.

In this example, the buttons 52 within the keypad 24 are coupled together and molded as a single membrane. The example buttons 52 are soft touch switches, which are formed of a softer polymer material that the surrounding the upper housing 28. A plurality of molded ribs 74 or depressions within the keypad 24 separate the buttons 52. The ribs 74 provide tactile feedback to a key fob operator to facilitate distinguishing between adjacent buttons 52 within the keypad 24. The ribs 74 provide separation between adjacent buttons 52 and facilitate movement of the buttons 52, especially soft touch switches. The ribs 74 require less packaging space than former external supports, which reduces the packaging area required for buttons 52 and the keypad 24.

Molding the keypad 24 from a single sheet of material minimizes gaps within the key fob 20. For example, as the ribs 74 are molded within the keypad 24, there is no path or opening from the exterior of the keypad 24 to the interior of the key fob 20 through adjacent buttons 52. In the example key fob 20, paths or openings are limited to the perimeter edges of the keypad 24 in the assembled position, such as the area near the opening 64 in the upper housing 28, or the interface between the upper housing 28 and the lower housing 32. Limiting paths to the interior of the key fob assembly 20 decreases the propensity for leaks and moisture entering the key fob 20, which protects components contained therein.

The undersides of the buttons 52 include associated snap domes 48 extending away from the key pad 24. Apertures 44 within the reinforcement member 36 permit the snap domes 48 to extend from the keypad 24 toward a respective circuit 78 on the circuit board 40, which is a printed circuit board in this example. Contacting one of the circuits 78 with one of the snap domes 48 closes that circuit. As known, closing a circuit may initiate a variety of functions, including vehicular functions such as locking or unlocking a car door. Other examples may include extensions such as poly domes instead of snap domes 48.

Other than the apertures 44, the reinforcement member 36 extends across the key fob 20. In this example, the reinforcement member 36 is molded as a single structure. Portions of the keypad 24, such as the ribs 74, rest directly on the reinforcement member 36. Supporting the keypad 24 in this manner strengthens the areas of the key fob 20 near the buttons 52 without limiting movement of the buttons 52 or substantially disrupting the continuity of the keypad 24.

The opposing side of the reinforcement member 36 directly contacts portions of the circuit board 40, which similarly strengthens the key fob 20. As known, strengthening the key fob 20 enhances performance and durability of the key fob 20 when loaded. To enhance the support of the circuit board 40, the reinforcement member 36 may include a flange 82 extending from the reinforcement member 36 for receiving the circuit board 40 and protecting the edges of the circuit board 40. In this example, the flange 82 also maintains the position of the circuit board 40 relative to the reinforcement member 36.

The upper housing 28 and the lower housing 32 attach with snap tabs in this example. Securing the key fob assembly 20 secures the keypad 24, the reinforcement member 36 and the circuit board 40 within the upper housing 28 and the lower housing 32. Other examples may include welding or heat staking the upper housing 28 to the lower housing 32, as well as welding, heat staking, or snapping the reinforcement member 36 to the upper housing 28, the lower housing 32, or both. When the upper housing 28 is secured to the lower housing 32 the ridge 68 around the opening 64 clamps the keypad 24.

While the preferred embodiment of this invention has been disclosed, a worker of ordinary skill in the art would recognize that certain modifications would come within the scope of this invention. For that reason, the following claims should be studied to determine the true scope and content of this invention.

The invention claimed is:

1. A key fob assembly, comprising:
- a circuit board having a plurality of circuits;
- a keypad having a plurality of coupled buttons operative to close said plurality of circuits; and
- a reinforcement member secured to a key fob housing between said circuit board and said keypad, said reinforcement member abutting said circuit board, wherein said reinforcement member surrounds opposing laterally outer perimeter edges of said circuit board.

2. The key fob assembly of claim 1, including an upper housing and a lower housing, said reinforcement member and said lower housing holding said circuit board.

3. The key fob assembly of claim 1, wherein said reinforcement member surrounds a perimeter edge of said circuit board.

4. The key fob assembly of claim 1, wherein one of said plurality of coupled buttons includes an extension for contacting one of said plurality of circuits through at least one aperture within said reinforcement member.

5. The key fob assembly of claim 1, wherein said reinforcement member contacts said keypad and said circuit board.

6. The key fob of claim 1 wherein ultrasonic welding secures said reinforcement member.

7. The key fob of claim 1 including a snap dome for communicating movement of one of said plurality of coupled buttons to one of said plurality of circuits.

8. The key fob of claim 1 wherein said keypad comprises a soft-touch keypad.

9. The key fob of claim 1 wherein said keypad comprises a continuous sheet of material.

10. The key fob of claim 1 wherein said plurality of coupled buttons are molded together.

11. The key fob of claim 1 wherein said keypad and said key fob housing cover said reinforcement member.

12. The key fob of claim 1 wherein said circuit board is a printed circuit board.

13. The key fob assembly of claim 1, wherein the reinforcement member directly contacts said circuit board.

14. The key fob assembly of claim 1, wherein the reinforcement member is made of a single material.

15. The key fob assembly of claim 1, wherein the reinforcement member is a monolithic structure.

16. A key fob assembly, comprising:
- a circuit board having a plurality of circuits;
- a keypad having a plurality of coupled buttons for closing said plurality of circuits;
- an upper housing;
- a lower housing for engaging said upper housing; and
- a reinforcement member at least partially located between said circuit board and said keypad, said reinforcement member and said lower housing holding said circuit board.

17. The key fob assembly of claim 16, wherein said reinforcement member directly contacts said circuit board.

18. The key fob assembly of claim 17, wherein the reinforcement member extends closer to the perimeter of the key fob than the circuit board.

19. The key fob assembly of claim 16, wherein said reinforcement member surrounds a perimeter edge of said circuit board.

20. The key fob assembly of claim 16, wherein said reinforcement member surrounds opposing laterally outer perimeter edges of said circuit board.

21. The key fob assembly of claim 16, wherein the reinforcement member is molded as a single structure.

* * * * *